(12) United States Patent
Spangaro (10) Patent No.: US 7,750,669 B2
(45) Date of Patent: Jul. 6, 2010

(54) REPROGRAMMABLE INTEGRATED CIRCUIT

(76) Inventor: Justin Martin Spangaro, 5 Weeroona Street, Port Melbourne, VIC (AU) 3207

( * ) Notice: Subject to any disclaimer, the term of this patent is extended or adjusted under 35 U.S.C. 154(b) by 0 days.

(21) Appl. No.: 11/794,335

(22) PCT Filed: Jan. 6, 2006

(86) PCT No.: PCT/AU2006/000016

§ 371 (c)(1),
(2), (4) Date: Apr. 25, 2008

(87) PCT Pub. No.: WO2006/072142

PCT Pub. Date: Jul. 13, 2006

(65) Prior Publication Data

US 2008/0309370 A1 Dec. 18, 2008

Related U.S. Application Data

(60) Provisional application No. 60/662,359, filed on Mar. 17, 2005.

(30) Foreign Application Priority Data

Jan. 6, 2005 (AU) .............................. 2005900059

(51) Int. Cl.
*H03K 19/177* (2006.01)
(52) U.S. Cl. .......................................... 326/38; 326/41
(58) Field of Classification Search ............... 326/37–41
See application file for complete search history.

(56) References Cited

U.S. PATENT DOCUMENTS

| | | | |
|---|---|---|---|
| 4,458,297 A | 7/1984 | Stopper et al. | |
| 5,191,241 A | 3/1993 | McCollum et al. | |
| 5,406,138 A | 4/1995 | Srinivasan et al. | |
| 5,436,480 A | 7/1995 | Yu | |
| 6,034,541 A | 3/2000 | Kopec, Jr. et al. | |
| 6,337,579 B1 * | 1/2002 | Mochida | 326/41 |
| 6,452,259 B2 * | 9/2002 | Akiyama | 257/686 |
| 6,732,068 B2 | 5/2004 | Sample et al. | |
| 6,781,226 B2 * | 8/2004 | Huppenthal et al. | 257/686 |
| 7,348,795 B2 * | 3/2008 | Scheppler et al. | 326/38 |
| 2001/0039634 A1 | 11/2001 | Hecht et al. | |
| 2002/0175398 A1 | 11/2002 | Lan et al. | |
| 2004/0268286 A1 | 12/2004 | New et al. | |

OTHER PUBLICATIONS

International Search Report mailed Feb. 3, 2006.
Hu B. et al.: "Synthesis and Placement Flow for Gain-Based Programmable Regular Fabrics," ACM ISPD 2003, Apr. 6-9, 2003, Section 4.
Hu et al., "Synthesis and Placement Flow for Gain-Based Programmed Regular Fabrics," International Symposium on Physical Design (ISPD 2003), Apr. 6-9, 2003, Monterey, California, pp. 197-203.

* cited by examiner

*Primary Examiner*—Don P Le
(74) *Attorney, Agent, or Firm*—Nixon & Vanderhye PC (57) ABSTRACT

A reprogrammable integrated circuit, including one or more logic dies including circuit components; and one or more reprogrammable interconnect dies including reprogrammable interconnect components electrically connected to the circuit components to define signal routing paths between the circuit components to allow a user to develop an integrated circuit.

39 Claims, 9 Drawing Sheets

REPROGRAMMABLE INTEGRATED CIRCUIT

This application is the U.S. national phase of International Application No. PCT/AU2006/000016 filed 6 Jan. 2006 which designated the U.S. and claims priority to AU 2005900059 filed 6 Jan. 2005 and U.S. 60/662,359 filed 17 Mar. 2005, the entire contents of each of which are incorporated herein by reference.

FIELD OF THE INVENTION

The present invention relates to a reprogrammable integrated circuit, an interconnect die, a logic die, a reprogrammable interconnect, and an integrated circuit production process.

BACKGROUND

Integrated circuits that can be customised may be classified into one of two broad classes: programmable and non-programmable. Programmable devices, such as Field-Programmable Gate Arrays (FPGAs), are semiconductor integrated circuit devices that can be programmed once or repeatedly reprogrammed to perform functions customised to particular applications. Non-programmable customised devices, such as application-specific integrated circuits (ASICs), also perform functions customised to particular applications but customisation occurs through a manufacturing-based process. Once an ASIC has been manufactured, these functions are fixed and cannot be altered. Also available are integrated circuits that incorporate both programmable and non-programmable circuitry in a single device.

The ability to easily program and reprogram FPGAs makes them well suited for developing new integrated circuits. However, FPGAs typically occupy between 20 and 40 times the surface area of semiconductor or footprint than an equivalent standard-cell ASIC, have poorer power and circuit speed performance, offer fewer degrees of freedom for user customisation, provide a smaller number of gates available for implementation, and are also considerably more expensive on a per-unit basis. Moreover, once a new circuit has been verified to function properly, programmability is normally no longer required. At this point, it is more important to have a low cost device such as an ASIC. However, the cost of initially developing a new customised ASIC is extremely high, and such non-recurring engineering (NRE) costs make ASICs attractive only when produced in high volumes so that the NRE costs can be absorbed without appreciably increasing the cost per unit, or when the number of gates required exceeds the capacity of an FPGA, or when specialised functionality not available in an FPGA is required, or when high speed or low power operation is required and cannot be achieved with an FPGA.

To alleviate the high development costs of a new ASIC, an FPGA can be used to develop a prototype of a new integrated circuit which, once verified, can then be translated into an equivalent ASIC circuit. However, the translation process is not straightforward and can be excessively time consuming and costly. Moreover, structural differences between FPGA and ASIC circuit components and interconnects can cause the FPGA and ASIC implementations of the final circuit to behave differently, which greatly complicates the translation process. Further, as FPGAs are unable to provide as many gates as ASICs, such an approach necessarily limits the number of gates that can be so prototyped. A possible workaround is to use multiple FPGAs for prototyping and a single ASIC for production; however, this even further complicates the translation process. Moreover, multiple FPGAs in a prototype system cannot be readily substituted with an ASIC due to the difference in form factor of their respective packages.

To address these difficulties, a customisable integrated circuit platform referred to as a 'structured ASIC' (sometimes referred to as a 'platform ASIC') has been developed. Structured ASICs provide a compromise between the low-cost reprogrammability of FPGAs and the low per-unit cost of ASICs. A structured ASIC provides a variety of predefined generic active circuit blocks or modules, including input/output (I/O) blocks, diffused memory, diffused intellectual property (commonly referred to as 'diffused IP'; i.e., predefined complex custom circuit elements such as phase-locked loops (PLLs), microprocessors, etc), and logic fabric (which may include look-up-tables (LUTs), programmable arrays or alternately a 'sea of gates' or some other form of logic fabric), which for convenience are all referred to herein as logic blocks or logic components.

A structured ASIC is physically customised by defining only the fixed routing layers and/or vias that interconnect these logic blocks to define a new circuit topology. (Some structured ASICs can also be effectively "customized" through the use of programmable lookup tables which reside in the logic fabric; however, the physical implementation of the lookup tables is fixed and cannot be altered.) Thus the predefined logic blocks provide the benefits of low unit cost and efficient use of semiconductor real estate, while the routing layers provide an ability to customise at a relatively low cost, since NRE costs associated with predefined layers can be amortised across many customers and/or products. In particular, the ability to develop prototypes using the same ASIC logic blocks that will be used in the final product avoids the need to translate the prototype circuit from an FPGA platform to the ASIC platform. However, despite the many advantages of structured ASIC technology, the development of new prototype circuits nevertheless requires one or more new routing layer and/or via masks to be developed, and this can be time consuming, prone to error, and expensive. Maskless technologies that use e-beam or other approaches to customise the routing have been developed as an alternative, but are an expensive and time consuming method of customising interconnect compared to traditional FPGAs.

One of the advantages of FPGAs over ASICs is that reprogrammability can be used to facilitate circuit design debugging. If a particular node internal to the FPGA needs to be observed, a debugging version of the circuit can be programmed to connect that node to an otherwise unused input/output pin, or alternately to provide an external input signal to a portion of the circuit that would not normally be accessible in the final implementation. Additionally, this allows the circuit to be developed in stages, and tested and debugged incrementally, which can greatly simplify circuit design verification. Further, if required, special purpose test circuits can be incorporated in the circuit during testing, provided that a sufficient number of gates is available to accommodate these test circuits, and then discarded if desired for a production version of the circuit. None of these techniques are readily available in the case of ASICs due to the high cost and manufacturing time associated with ASIC prototype production. Due to the potentially larger size and complexity of ASICs and the lack of availability of the above techniques, ASICs are consequently much more difficult to debug than FPGAs.

Since ASICs lack reprogrammability, the traditional ASIC approach typically requires compromises to be made in providing the physical die resources necessary to ensure that a device can be tested and debugged sufficiently to verify the correctness of the design. (The word 'die' is a term of art that refers to a portion of a processed semiconductor wafer that provides an electronic, optoelectronic, or other type of device. In general, a semiconductor wafer is processed to produce a large number of typically identical devices in order to take advantage of the economies of scale available from batch processing. After these devices are formed in the wafer, the processed wafer is cut into a large number of typically identical rectangular or square pieces, each piece subsequently being packaged to provide a single saleable unit. Each of those pieces of the wafer is referred to as a die or chip.)

There are typically two classes of testing that need to be performed on a given circuit design, respectively referred to herein as "design verification" and "production test". It is a general requirement that an integrated circuit be testable in order to verify the circuit, a process referred to as design verification. However, additional test measures are usually implemented to ensure that production quality can be monitored to eliminate defective parts as they are manufactured, a process referred to herein as "production test". Once the circuit design has been verified, there is usually no further need to repeat that verification.

The ability to test a selected logic circuit under specified conditions is limited by the degree to which the state of logic input nodes can be manipulated (referred to as "controllability") and the ability to monitor the state of logic output nodes (referred to as "observability"). Non-binary (i.e., analog) circuits are also subject to the same principles.

Typically, dedicated test structures such as 'boundary scan' or internal scan paths are added to the circuit topology to facilitate at least production test. Production test observability and controllability is generally achieved by configuring the logic circuits internally into dedicated test configurations during which the device is otherwise non-operational.

In order to provide the necessary observability and controllability for design verification of an ASIC, various methods can be employed. Usually, the external input and output pins are controlled and observed respectively by means external to the device. The means of control and observation can be provided by either application-specific test hardware, or general purpose test equipment configured to suit design verification of the device under test. However, the approach whereby external input and output pins provide the means of testing the device is necessarily limited by the degree of controllability and observability that the external pins are able to provide. Further difficulty often exists in providing the necessary capability in the external means of control and observation to provide the degree of control and observation required to perform design verification. This is due to the speed and complexity of the necessary device stimuli and response behaviour, hence the provision of external means of control and observation having the desired degree of complexity and performance is usually complex and expensive.

To overcome the limitations of design verification by external stimulation and observation, alternately or additionally certain circuit functionality internal to the device itself can be employed to enhance controllability and observability and therefore device testability. This internal circuit functionality can be either be naturally included in the circuit design as part of its normal functioning, or incorporated specifically and additionally for the purpose of enhancing testability, and frequently is provided as a combination of naturally included functionality and specific additional functionality. Incorporation of specific additional functionality can be useful for enhancing testability, but requires the addition of logic components specifically for the purposes of design verification into the device. The addition of test-specific logic components for testability necessarily imposes an overhead on both the design process and device manufacture because such components are designed prior to device fabrication, require additional semiconductor die area, and themselves need to be verified and tested as with the other circuitry of the device.

The state of the art in integrated circuit production is constantly evolving with such devices becoming more complex, operating at higher speeds, and incorporating an increasing amount of circuitry in a single device. Such trends place increasing demands on testability due to the various controllability and observability limitations of the approaches to test described above. The addition of internal connectivity and test-specific logic functionality to ASICs is a useful approach for enhancing testability, but is wasteful of semiconductor die area and introduces unwanted complexity into the design process.

Structured ASICs have similar debugging issues to those described above for ASICs. Unlike an FPGA, structured ASICs go through a physical manufacturing process in order to be "customised". This manufacturing process is costly and does not provide the quick turn-around time that is required to match the debugging capabilities of FPGAs.

In summary, while FPGAs offer rapid prototyping turn-around, low NRE costs, eliminate some design complexity (e.g. clock distribution), and permit easier debugging because they are reprogrammable, compared to ASICs they are expensive, slow, offer lower gate counts, consume more power, and provide fewer degrees of design freedom. Compared to FPGAs, ASICs are larger (more integrated), provide higher performance and lower power consumption, and are more malleable and much cheaper to manufacture in volume. However, they are also more complex and expensive to design, very expensive and slow to prototype, require detailed consideration of more factors (e.g., clock distribution), and are more difficult to debug. Structured ASICs attempt to provide a compromise between ASICs and FPGAs; however they still lack the reprogrammability that makes FPGAs attractive: the capability to be entirely reprogrammed without going through a physical manufacturing process. Another significant disadvantage of structured ASICs compared to FPGAs is that because they must go through a physical manufacturing process in order to be customized or "programmed" for use, they cannot be offered to customers as a standard component. A given FPGA can serve multiple customers and various end uses; in contrast, after manufacturing is complete, a given structured ASIC is specific to an individual customer and specific end use. It is desired to provide a reprogrammable integrated circuit, an interconnect die, a logic die, a reprogrammable interconnect, and an integrated circuit production process that alleviate one or more of the above difficulties, or at least provide a useful alternative.

SUMMARY OF THE INVENTION

In accordance with the present invention, there is provided an interconnect die, including reprogrammable interconnection components for defining signal routing paths between circuit components of one or more logic dies to allow a user to develop an integrated circuit.

The present invention also provides a logic die, including circuit components and connectors for said circuit components, said connectors being on a surface of said logic die for connection to corresponding connectors of a reprogrammable interconnection die having reprogrammable interconnection components, said corresponding connectors being connectors for said reprogrammable interconnection components to define signal routing paths between said circuit components of said logic die.

The present invention also provides a reprogrammable interconnect, including a plurality of reprogrammable interconnect dies bonded together in a stacked configuration, each of said plurality of reprogrammable interconnect dies including reprogrammable interconnection components for defining signal routing paths between circuit components of one or more logic dies to allow a user to develop an integrated circuit.

The present invention also provides a reprogrammable integrated circuit, including:

one or more logic dies including circuit components; and one or more reprogrammable interconnect dies including reprogrammable interconnect components electrically connected to said circuit components to define signal routing paths between said circuit components to allow a user to develop an integrated circuit.

The present invention also provides an integrated circuit production process, including:

programming at least one reprogrammable interconnect die to form programmed signal routing paths between circuit components of at least one first logic die electrically connected to said at least one programmable interconnect die; and forming fixed signal routing paths between circuit components of at least one second logic die substantially equivalent to said at least one first logic die, said fixed signal routing paths corresponding to said programmed signal routing paths.

The present invention also provides an integrated circuit production process, including generating fixed routing path data for use in forming fixed signal routing paths between circuit components of at least one first logic die on the basis of programmed signal routing paths defining programmed signal routing paths between circuit components of at least one second logic die electrically connected to said at least one reprogrammable interconnect die, the circuit components of said at least one second logic die being substantially equivalent to said at least one first logic die.

The present invention also provides an integrated circuit production process, including generating programmed routing path data for use in forming programmed signal routing paths between circuit components of at least one first logic die on the basis of fixed signal routing paths defining programmed signal routing paths between circuit components of at least one second logic die electrically connected to said at least one reprogrammable interconnect die, the circuit components of said at least one second logic die being substantially equivalent to said at least one first logic die.

BRIEF DESCRIPTION OF THE DRAWINGS

Preferred embodiments of the present invention are hereinafter described, by way of example only, with reference to the accompanying drawings, wherein.

DETAILED DESCRIPTION OF THE PREFERRED EMBODIMENTS

In the description below, like reference numerals are used to refer to like entities or features where convenient.

Figure 1:
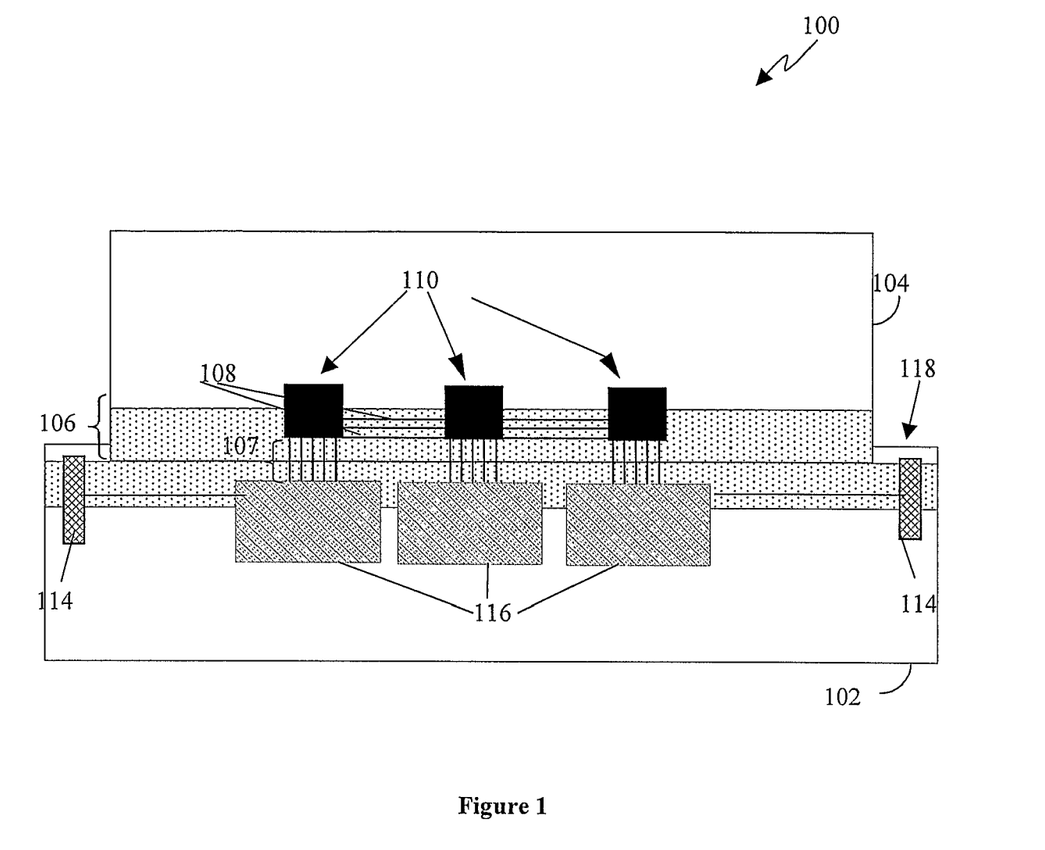
FIG. 1 is a schematic cross-sectional side view of a preferred embodiment of a reprogrammable integrated circuit, including a reprogrammable interconnect die bonded to a logic die in a stacked configuration.
Figure 5:
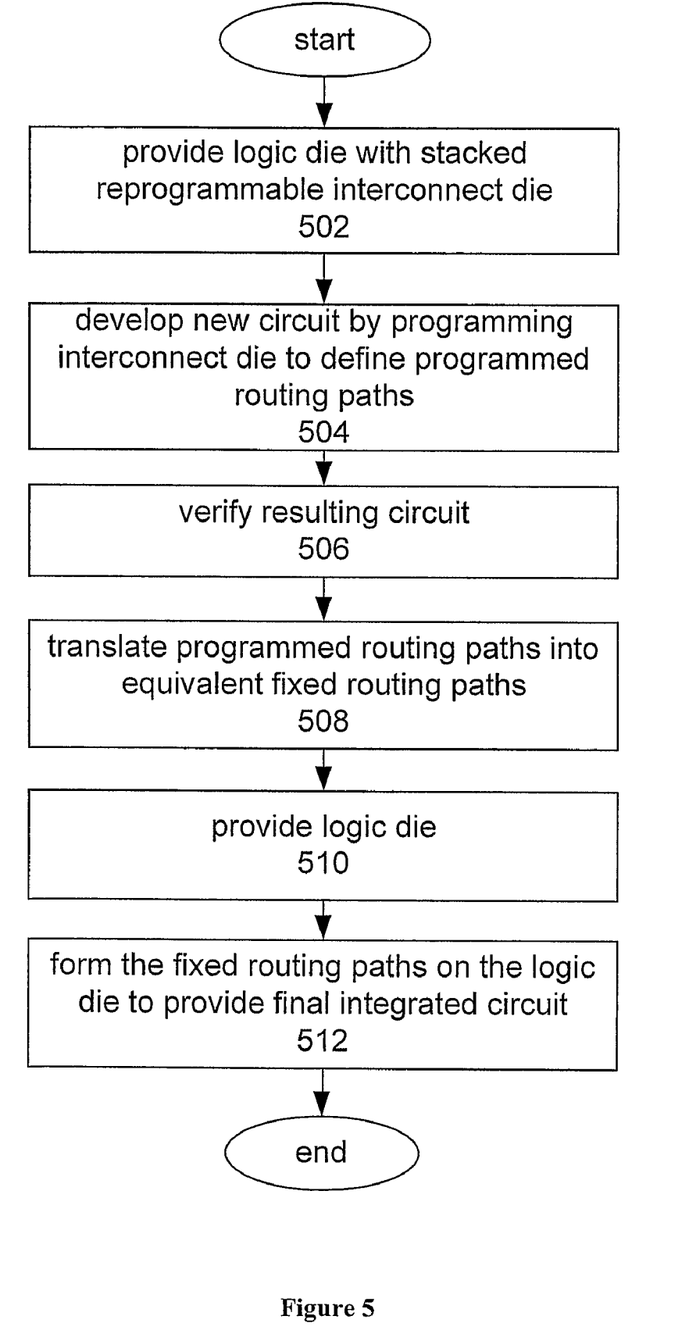
FIG. 5 is a flow diagram of a preferred embodiment of an integrated circuit production process.

As shown in FIGS. 1 and 5, an integrated circuit 100 and an integrated circuit production process combine the performance, power, and density characteristics of a standard structured ASIC with the re-programmability of an FPGA. The integrated circuit production process begins at step 502 by providing the reprogrammable integrated circuit 100, as shown in FIG. 1. The reprogrammable integrated circuit 100 includes a logic die 102 and a reprogrammable interconnect or routing die 104 bonded together in a stacked configuration and electrically interconnected using standard die stacking and interconnection technologies, as described below.

Figure 2:
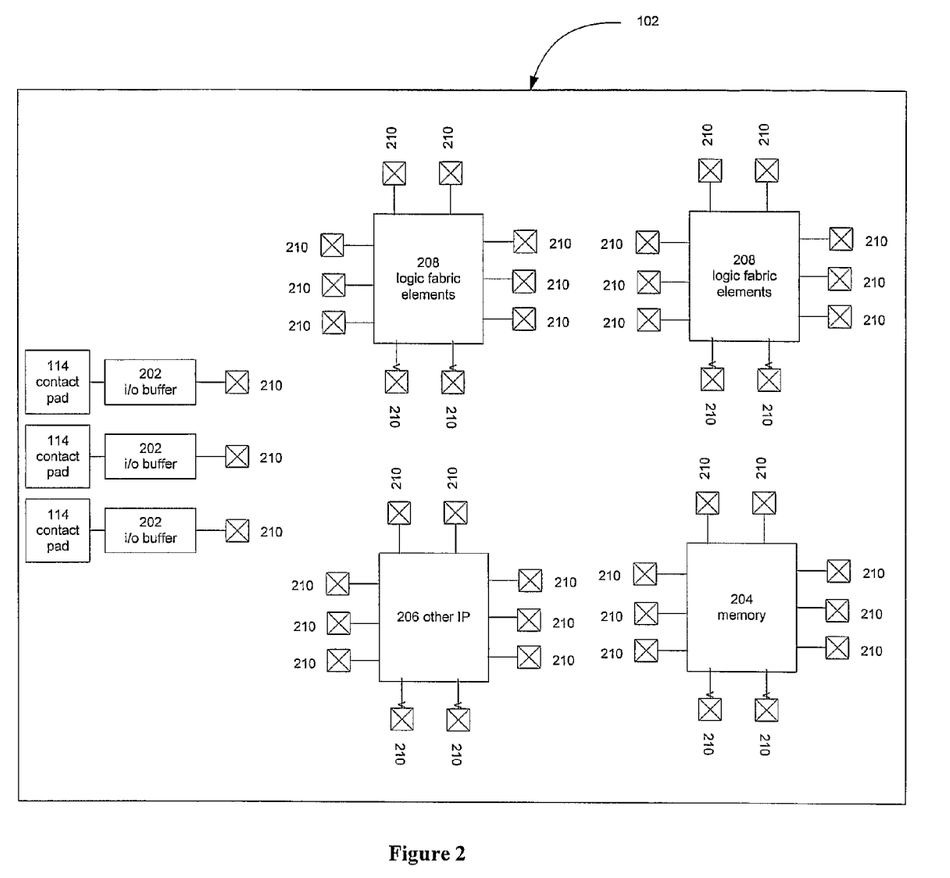
FIG. 2 is a schematic plan view of the logic die of the reprogrammable integrated circuit.

As shown in FIGS. 1 and 2, the logic die 102 includes generic circuit components that can be referred to collectively as logic blocks 116, including I/O buffers 202, diffused memory 204, diffused IP 206, logic fabric elements 208 containing combinational/sequential structures, and interconnect 210. The interconnect 210 is connected to interconnect 310 of FIG. 3 in the programmable interconnect die 104 through inter-chip contacts 107, as shown in FIG. 1 and described below. The logic die 102 also includes contact pads 114 for making electrical connections between the circuit components 202 to 208 and a package in which the integrated circuit is mounted, and may also be similarly used for power pin connections. The logic die 102 is a structured ASIC die with incomplete metal routing paths (the routing paths to be completed by routing paths residing in the programmable interconnect die 104, as described below), and may be a standard structured ASIC die known to those skilled in the art. However, it will be apparent to those skilled in the art that the logic fabric elements 208 in the logic die 102 may alternatively be based on a variety of logic architectures, ranging from coarse grained look-up table (LUT) structures—such as those commonly used in FPGAs; complex macro-cell architectures, typically comprising a FLOP, a plurality of NAND gates, a plurality of multiplexers, and a high-drive inverter—such as those used in structured ASICS; to fine grained transistor pair structures—such as those commonly used in gate arrays.

Figure 3:
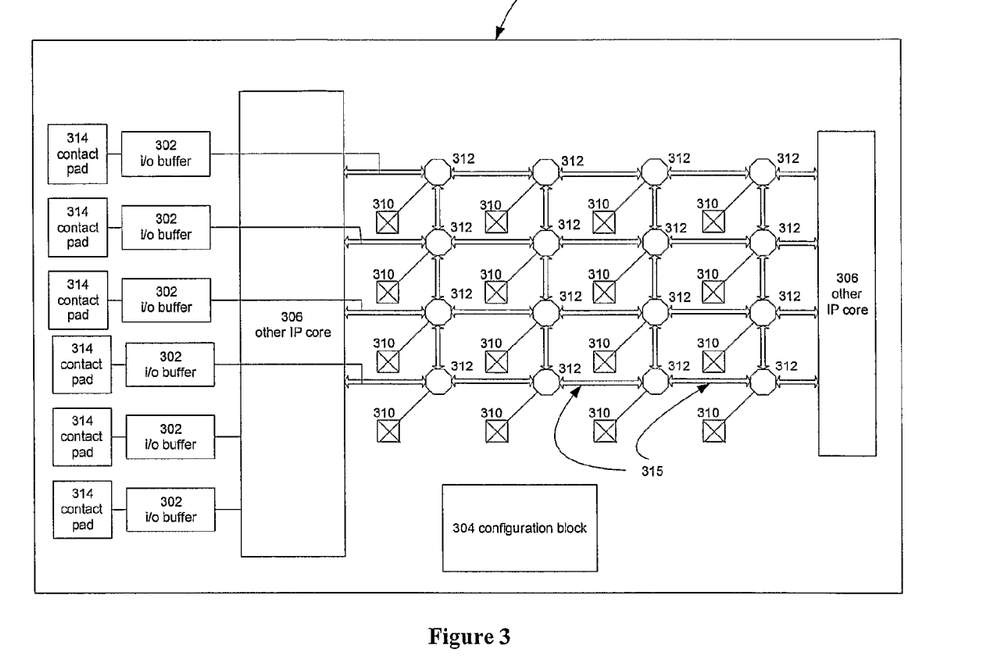
FIG. 3 is a schematic plan view of the reprogrammable interconnect die of the reprogrammable integrated circuit.

As shown in FIGS. 1 and 3, the reprogrammable interconnect die 104 includes programmable routing layers 106 comprising interconnect 310, interconnect between routing switches 110 and 312, routing switches 110 and 312, IP cores 306, and logic configuration blocks 304 that contain configuration data for the programmable routing. Although shown as a single region or block of the reprogrammable interconnect die 104, it will be understood by those skilled in the art that the logic configuration blocks 304 may in fact be distributed with the switches 312. The reprogrammable interconnect die 104 may also include contact pads 314 and I/O buffers 302 for making electrical connections to the circuit components 202 to 208 in cases where it is neither feasible nor desirable to make use of contact pads 114 and I/O buffers 202 on the logic die 102 itself. Each logic fabric element 208, diffused IP 206, and memory 204 in the logic die 102 is connected to the programmable interconnect die 104 by inter-chip contacts 107, preferably being vias formed between the two dies 102, 104 stacked face-to-face using what is referred to as 2.5 or 3 dimensional device integration, as described in, for example, *Advances in a Line Wafer Bonding for 3D Interconnects*, E. Lindner et al., Proceedings of the European Microelectronics Packaging and Interconnects Symposium, Poland, 2002, and at www.tezzaron.com/products/technology/3D IC Summary.htm. Currently available via interconnect technologies provide up to 8 million inter-chip contacts between two stacked 1×1 cm² dies. The logic die 102 can also include logic blocks that do not require programmable routing, such as a microprocessor logic block. The routing associated with these blocks can be fixed and does not need to be connected to the reprogrammable interconnect die 104.

Figure 4:
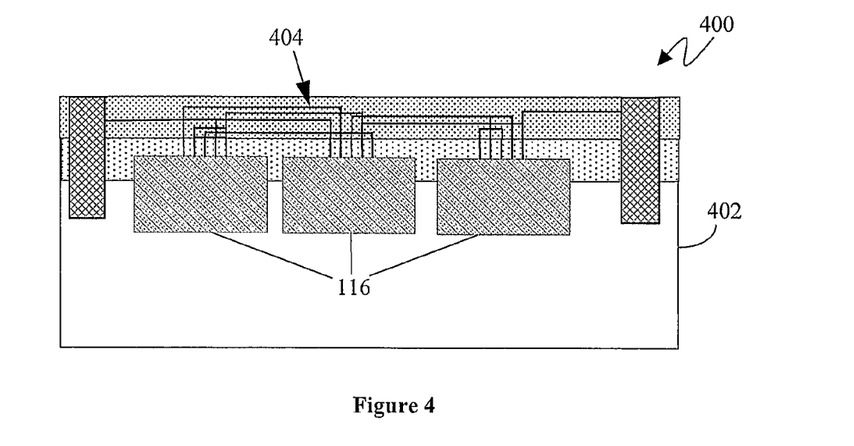
FIG. 4 is a schematic cross-sectional side view of a structured ASIC derived from the reprogrammable integrated circuit.

In the described embodiment, the logic die 102 provides the same circuit components 116 as a standard structured ASIC, and the reprogrammable interconnect die 104 provides reprogrammable interconnection components for defining signal routing paths between these circuit components, in a manner analogous to a standard FPGA. During prototyping and development at step 504, the signal routing paths in the reprogrammable interconnect die 104 can be reprogrammed as many times as required until the resulting circuit has been functionally verified. Once verified at step 506, the routing paths programmed into the reprogrammable interconnect die 104 are translated into equivalent fixed routing paths at step 508. This typically involves generating fixed routing path data that is used to produce one or more photolithography masks defining the routing paths, although maskless lithography processes such as e-beam lithography can alternatively be used. At step 510, a bare logic die 402 with incomplete routing is provided. This logic die 402 is typically, but not necessarily, identical to the logic die 102 in the reprogrammable integrated circuit 100. At step 512, fixed routing paths 404 corresponding to those determined at step 508 are formed over the surface of the bare logic die 402 to interconnect the components of the logic die 402 and thereby provide a structured ASIC 400, as shown in FIG. 4. The fixed routing paths 404 are formed by depositing one or more conductive (e.g., metal) layers and any required insulating layers using standard deposition techniques known to those skilled in the art, such as physical and/or chemical vapor deposition. The resulting structured ASIC or integrated circuit 400 is functionally equivalent to the verified programmed circuit, but replaces the reprogrammable interconnect die 104 with fixed, hard-wired conductive paths 404.

Figure 6:
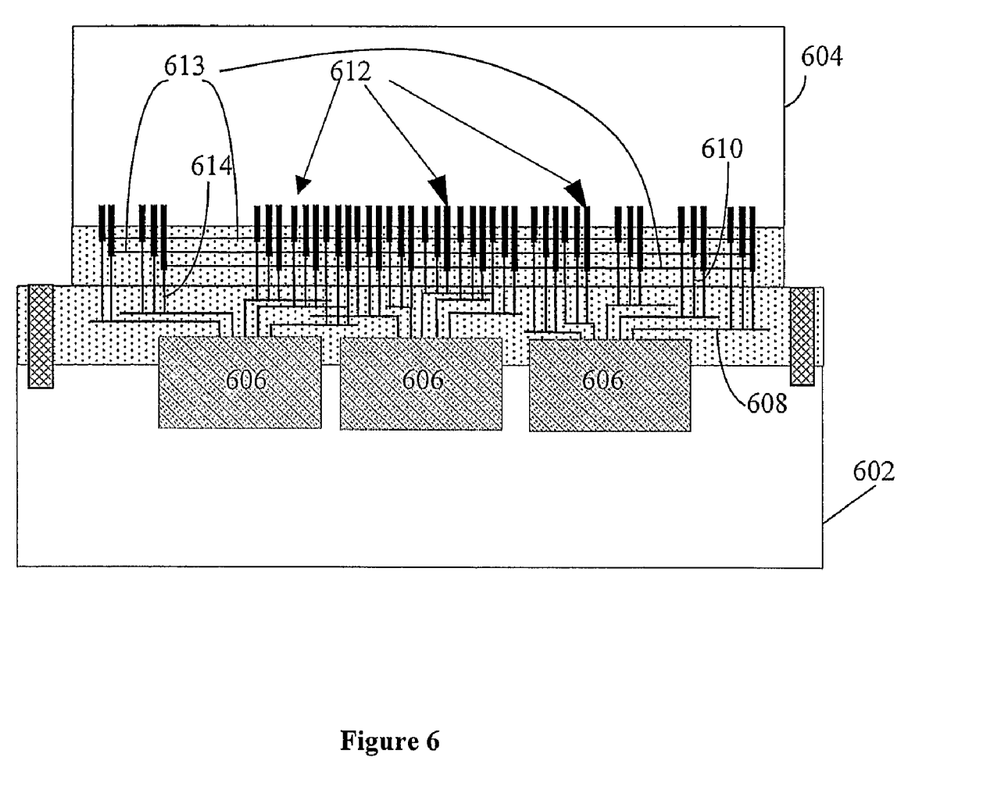
FIG. 6 is a schematic cross-sectional side view of an alternative embodiment of a reprogrammable integrated circuit.

In an alternative embodiment, as shown in FIG. 6, a logic die 602 and programmable interconnect die 604 are bonded together in a stacked configuration as described above. Incomplete interconnect portions 608 extend from each logic component 606 in the logic die 602. Similarly, incomplete interconnect portions 610 extend from each of the programmable routing components 612 in the reprogrammable interconnect die 604. By aligning and bonding the two dies 602, 604 together, vertical interconnect vias 614 are formed to make electrical connections between the incomplete interconnect portions 608 in the logic die 602 and the incomplete interconnect portions 610 in the reprogrammable interconnect die 602. The resulting interconnection paths connect the logic components 606 to the reprogrammable routing components 612, thus allowing the signal routing paths between the logic blocks 606 to be programmed as desired. In comparison with the first embodiment described above, the embodiment of FIG. 6 allows more of the routing connections to be included in the logic die 602 at the expense of requiring additional pairs of interconnect vias 610 and 614.

As shown in FIG. 1, the reprogrammable interconnect die 104 can be smaller than the logic die 102, allowing input/output (I/O) pads 114 to be provided on the exposed and unbonded projecting peripheral regions 118 of the logic die 102. However, it will be apparent that in further alternative embodiments the reprogrammable interconnect die could be the same size or larger than the logic die, with I/O pads being formed on the exposed lateral edges of the logic die. Alternatively, the reprogrammable interconnect die could be the same size or smaller than the logic die, but with I/O pads being provided on the reprogrammable interconnect die, in addition to those 114 on the logic die 102 as shown. In such an embodiment, the reprogrammable integrated circuit uses the I/O pads on the reprogrammable interconnect die, and the structured asic 400 uses the I/O pads on the logic die.

Additionally, if the reprogrammable interconnect die is substantially larger than the logic die, this allows the region of the reprogrammable interconnect die that is bonded to the logic die to be substantially dedicated to making electrical connections to the logic die, thereby allowing additional circuitry on the reprogrammable interconnect die, such as storage and testing circuitry, for example, to be located outside the bonded region.

In yet a further alternative embodiment, the reprogrammable interconnect die 104 is bonded to the logic die 102 as described above, and then etched back to remove most of the underlying substrate. High aspect ratio vias are then formed completely through the remaining thickness of the programmable interconnect die 102 to the logic die 102 in order to provide vertical electrical connections between the two dies 102, 104. In this embodiment, I/O contact pads are formed on the newly formed top surface of the reprogrammable interconnect die 104.

Although the reprogrammable integrated circuit has been described above in terms of a single logic die and a single reprogrammable interconnect die, it will be apparent that in general one or more logic dies and one or more reprogrammable interconnect dies can be bonded together in a stacked configuration to provide a reprogrammable integrated circuit with at least three stacked dies.

The logic die(s) can incorporate one or more alternative types of logic fabric—for example, "coarse-grained" structures such as lookup tables, or "fine-grained" programmable cells. Depending partly on the type of logic fabric structure used, the proportion of routing in the logic die(s) and reprogrammable interconnect die(s) may vary. For example, logic die(s) with coarse-grained logic fabric may contain the majority of routing in the form of fixed metal routing, while the routing in the associated reprogrammable interconnect die(s) may primarily consist of reprogrammable switching components, with a relatively minor amount of fixed metal routing. In contrast, logic die(s) with fine-grained logic fabrics may contain a minimal amount of routing compared to the reprogrammable interconnect die(s). The main purpose of the routing in the logic die(s) in this case is to connect from the logic die(s) to the reprogrammable interconnect die(s). In this case the reprogrammable interconnect die(s) contains the majority of routing compared to the logic die(s). In either configuration, the logic die(s) may also include routing that is not programmable such as for memory or special functions, for example.

Because the reprogrammable integrated circuit 100 and the final structured ASIC 400 are pin-compatible, they can be interchanged on the same printed circuit board. Moreover, because the logic dies 102, 402 used in the reprogrammable integrated circuit 100 and the structured ASIC 400 can be identical, with the exception of the upper interconnect layers, there is no need to translate the verified prototype circuit beyond generating fixed paths corresponding to the programmed paths. Thus the benefits of standard structured ASICs are realised.

However, by providing a reprogrammable routing or interconnect die over the structured ASIC die 102, the need to form fixed, physical routing paths during prototype development is avoided completely, thus simplifying such development and greatly reducing NRE costs. The translation from programmed routing to fixed routing is vastly simpler than translating a complete programmed FPGA circuit to an ASIC platform. The reprogrammable integrated circuit 100 thus combines the performance, power, and density characteristics of a standard structured ASIC with the reprogrammability of an FPGA.

The reprogrammable integrated circuit 100 can be reprogrammed as often as desired, so that the one reprogrammable integrated circuit 100 can be used to develop a wide variety of structured ASICs. Performance critical circuit components or circuit components with special requirements, such as memories, PLLs, etc, that do not need to be programmed, can be implemented on the logic die 102 using fixed metal interconnect only. As a result, the performance of these circuit components is identical on the reprogrammable integrated circuit 100 and the final non-programmable structured ASIC.

The programmable interconnect die 104 can be based on a different process technology than the logic die 102, which may be advantageous. In particular, it allows the programmable interconnect die 104 to use a process technology that provides higher performance but would be too costly for volume production. For example, the programmable interconnect die 104 could use a silicon process technology with a smaller feature size, or could use a GaAs or silicon-on-insulator (SOI) substrate, such as a silicon-on-sapphire (SOS) substrate, or some other process technology. Thus the reprogrammable interconnect die could have much higher performance and/or density than if it used the same technology as the logic die 102. This may be desirable as the routing paths in the reprogrammable integrated circuit 100 will be longer than the equivalent paths in the final structured ASIC 400, and thus it is desirable to implement the reprogrammable interconnect paths using a higher performance process technology. The use of different process technologies allows the reprogrammable integrated circuit 100 to be manufactured at an acceptable, albeit higher, cost at relatively low volumes, whilst facilitating the development of low-cost mass-produced custom ASICs. The use of a separate reprogrammable interconnect die also provides flexibility in the granularity of its routing components: the logic die 104 can be based on a coarse-grained architecture as in an FPGA (which requires fewer programmable interconnects), or a finer-grained architecture as in a structured ASIC (which requires more programmable interconnects). Reprogrammable interconnects require a large number of associated switching transistors which may require a relatively large silicon area. The ability to use a reprogrammable interconnect die based on a process technology with a smaller feature size (i.e., higher density) than in the logic die allows a larger number of interconnect transistors to be used. The programmable interconnect die 104 may operate at a different voltage level than the logic die 102, which may be advantageous, especially if the logic and routing die are implemented using different process technologies.

When developing a new circuit prototype, the programmed signal routing paths may be based on desired or actual fixed routing paths on the second logic die 402. For example, the programmed signal routing paths can be developed prior to actual fabrication of a corresponding bare logic die containing associated fixed signal routing paths which can themselves be designed to achieve a specified performance; for example, timing performance such as satisfaction of setup and hold time constraints.

Due to the identical (or at least substantially equivalent) nature of the logic die(s) of the reprogrammable integrated circuit and the target logic die(s) on which the fixed interconnect will be formed, the programmed signal routing paths can be developed to provide a useful degree of correlation between the timing and performance of both the programmed circuit prototype and the corresponding fixed implementation of that circuit. However, due to the use of reprogrammable routing logic in the interconnects of the reprogrammable prototype circuit, the reprogrammable prototype circuit may not be able to achieve the same absolute timing performance as the corresponding fixed implementation of the same circuit topology. Nevertheless, a useful degree of correlation in relative timing performance can usually be maintained between the fixed and programmable implementations of a circuit. This correlation can be used to advantage to qualify both the functional correctness of the fixed circuit as well as providing a useful indication of its relative timing-based performance by testing the reprogrammable implementation. Thus the reprogrammable circuit can be used to functionally verify the logic on the corresponding fixed implementation of that circuit by inference, while operating under relaxed but proportionally scaled timing conditions and to thus provide an indication of the timing performance achievable with the fixed circuit.

In yet a further alternative embodiment, logic components and/or interconnections between logic circuits, logic circuit nodes and/or input/output pads of the reprogrammable integrated circuit are provided that are dedicated to or can be applied to design verification testing. Such logic components or interconnections can be provided on either the logic die(s) or the programmable routing die(s) or both, separately or in combination, for testing purposes, including design verification. Although one or more of these design verification logic components can be included on the logic die(s) of the reprogrammable integrated circuit, they can be omitted from the logic die(s) used to form the fixed circuit.

The logic die(s) used in the fixed circuit can include predefined fixed circuit topology that is absent from the logic die(s) used in the reprogrammable circuit, and the reprogrammable interconnect in the reprogrammable interconnect die(s) can be programmed to represent at least a subset of this fixed circuit topology. The reprogrammable interconnect can also be programmed to provide connectivity to logic components of the logic die(s) in the reprogrammable integrated circuit for enhancing testability, and such connectivity can be omitted from the corresponding fixed circuit implementation.

The cell architecture of an ASIC or structured ASIC can be designed to reduce the number of custom masks required to just one, as described in U.S. Pat. No. 4,197,555, resulting in significant cost and time savings. A "one mask" device allows all of the masks but one to remain generic. This allows a structured ASIC device manufacturer to invest in the generic or base masks just one time so that the associated costs can be amortised across multiple application-specific devices. Different circuit topologies are implemented by customizing just a single mask instead of a complete mask set.

Figure 7:
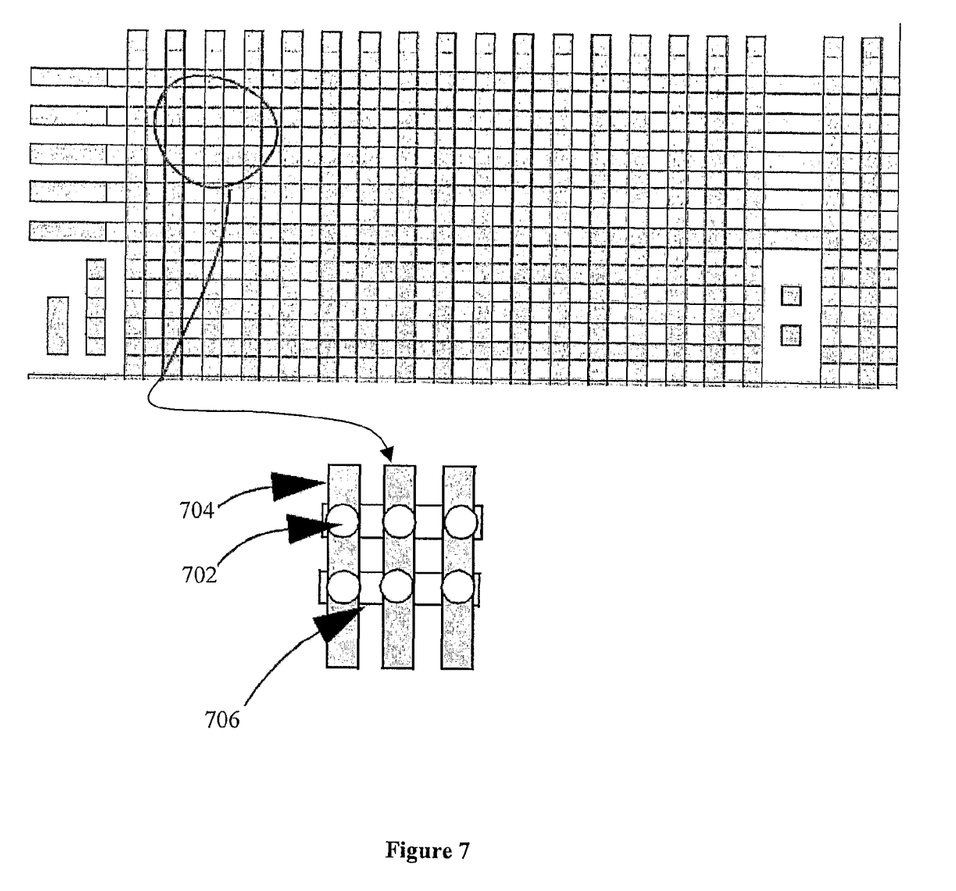
FIG. 7 is a schematic plan view of crossbar type via-programmable metal routing layers in a ViaMask™ routing fabric of the prior art, and a magnified view showing the use of vias to interconnect selected lines of the routing layers.
Figure 8:
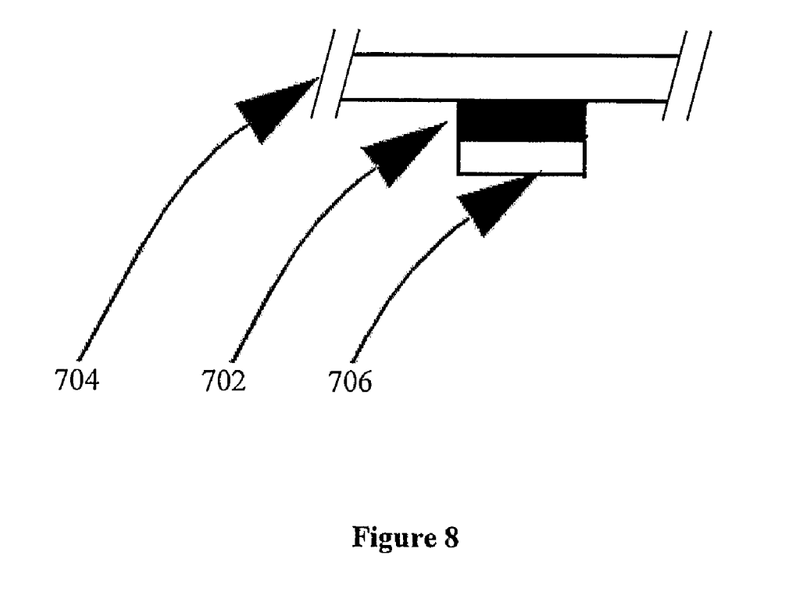
FIG. 8 is a schematic cross-section through one of the vias of FIG. 7.
Figure 9:
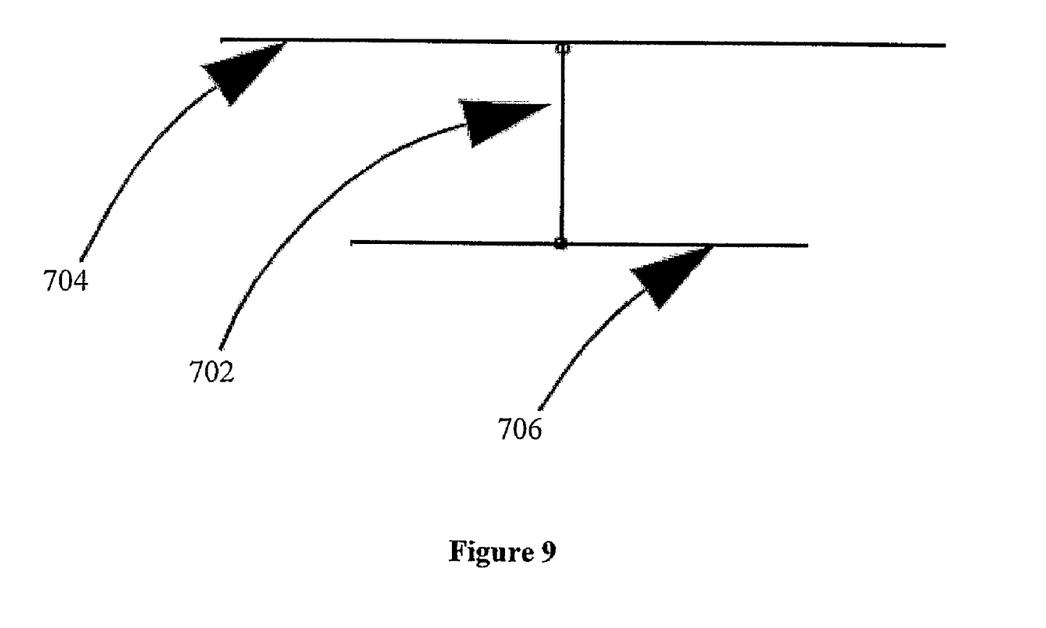
FIG. 9 is a schematic circuit equivalent of the via of FIG. 8.

A "single via mask" device is a variation of a "one mask device". As described in U.S. Pat. No. 4,197,555 to Vehara, and U.S. Pat. No. 6,819,136 to Or-Bach, a "single via mask" device is programmed by customizing a via mask that determines the locations of vias that connect different layers of the device. Those locations are selected from a large number of predetermined locations where vias can optionally be placed, depending on the requirements of the circuit developer. For example, FIG. 7 is a schematic plan view of a portion of a via-mask programmable fabric, including an enlarged view of a selected portion of that fabric in which vias 702 has been formed. In general, each layer is patterned to form a plurality of electrically isolated partial routing paths, typically in the form of a series of parallel elongated routing lines, with the lines in adjacent (but not touching) metal layers being mutually orthogonal. It will be apparent that this arrangement defines a large number of potential interconnect locations where the routing lines overlap or intersect in plan view. The via-mask programmable fabric is programmed by placing vias 702 at selected ones of those potential locations to connect corresponding portions or routing lines of the different metal interconnect layers 704, 706 to one another. A cross-section through one of the vias 702 is shown in FIG. 8 where the via metal 702 contacts the overlying routing line 704 and the underlying routing line 706, thus establishing an electrical interconnection between those two lines 704, 706. A schematic circuit equivalent representation of FIG. 8 is shown in FIG. 9, where the via 702 is represented as a wire 702 interconnecting the metal interconnect layers represented as wires 704 and 706. A significant limitation of a "single via mask" approach is that this type of device is not reprogrammable.

In yet a further preferred embodiment, the reprogrammable integrated circuit 100 is based on a modified version of a "single via mask" device logic die, such as that described in U.S. Pat. No. 6,580,289, and the fixed circuit version of the reprogrammable integrated circuit 400 is based on the unmodified "single via mask" logic die from which the modified die was derived. Rather than making permanent connections between adjacent routing layers using vias (as would be provided in a standard "single-via-mask" structured ASIC), the reprogrammable integrated circuit 400 uses a programmable routing fabric located in the routing die 104 to perform an equivalent function to that of the customizable vias, except that the customisable connections between routing connections remain software programmable in the reprogrammable integrated circuit 400.

Although it may be possible to form access vias at locations other than the standard 'intersection' locations in a via-programmable logic die in order to make electrical connections to the metal layers in that die without shorting those layers together with the access vias, this approach may be impractical for at least some logic dies due to the need to form two vias for each interconnection and to avoid any forming the vias through any overlying structures or circuit elements. Consequently, the reprogrammable form of the device is preferably formed by attaching a reprogrammable interconnect die to a modified form of the via-programmable logic die in which at least a portion of at least one of the metal layers is effectively moved from the logic die to the reprogrammable interconnect die. This can be achieved either by omitting the corresponding layer formation step altogether during manufacture of the logic die, or by modifying the lithography masks (or pattern if maskless lithography is used) for those layers to remove selected portions of those layers. The latter arrangement may be preferred in some cases as it allows other (fixed) interconnections to be made in the logic die using the remaining portions of the metal layers. In either case, the omitted portions or omitted layer is instead formed in the reprogrammable interconnect die that is bonded to the logic die, and the two layers are then electrically interconnected by connected vias formed in each of the two dies, with a programmable switch in the path between the two metal layers so that the interconnection can be repeatedly reprogrammed as desired. After a desired integrated circuit topology has been developed, a production version of the device can then be mass produced at low cost by forming vias at appropriate locations in the unmodified version of the logic die that includes all of the metal routing layers.

Figure 10:
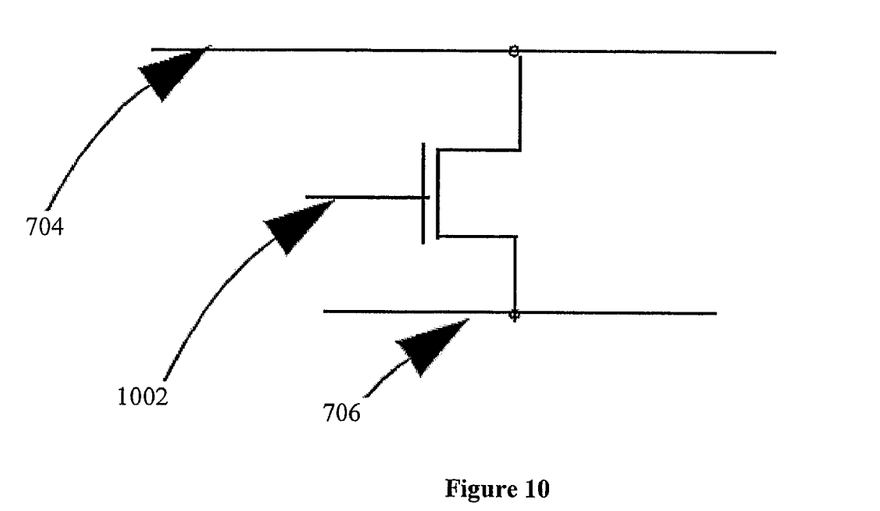
FIG. 10 is a schematic circuit equivalent of an arrangement whereby the via of FIGS. 8 and 9 is replaced by a reprogrammable transistor in accordance with one preferred embodiment of the invention.
Figure 11:
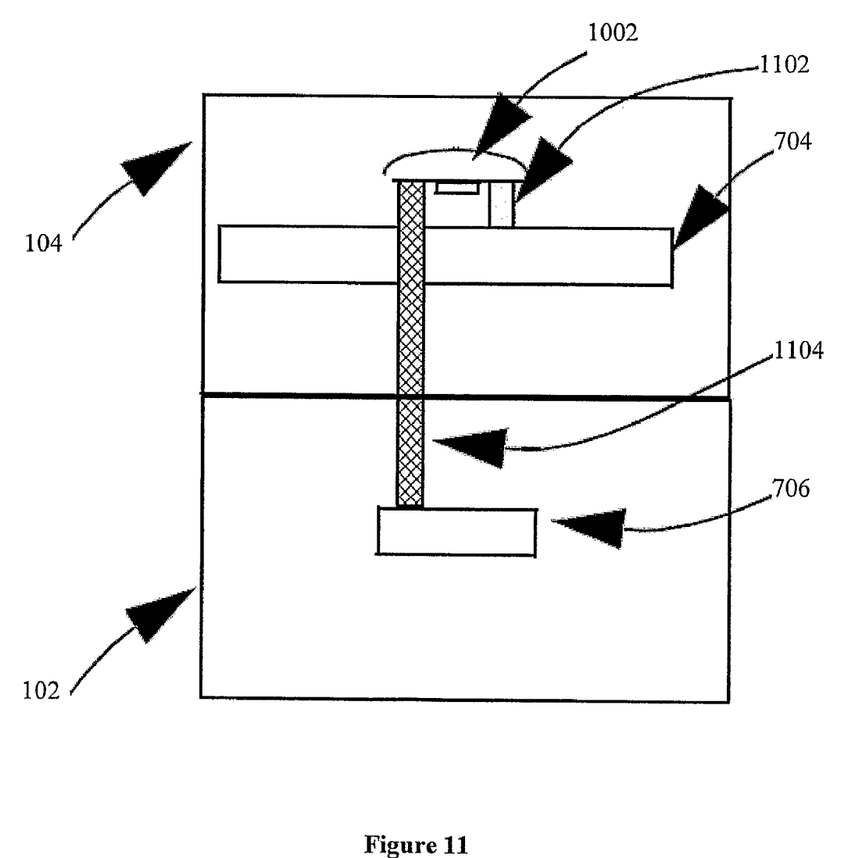
FIG. 11 is a schematic cross-section of an embodiment of a reprogrammable integrated circuit whereby a transistor in the routing die is used to define a reprogrammable interconnection between a first routing line in the routing die and a second routing line in a logic die bonded to the routing die.

For example, FIG. 10 is a schematic circuit equivalent representation of a reprogrammable version of the circuit in FIG. 9, where a transistor 1002 is used instead of the wire 702. The upper wire 704 and transistor 1002 are provided in the routing die 104, and the lower wire 706 is provided in the logic die 102, as shown in the schematic cross-sectional side view of FIG. 11. In this embodiment, the via 702 has been replaced by a transistor 1002 which connects to the metal interconnect layers 704 and 706 through via structures 1102 and 1104. The via structure 1104 is completed by inter-chip contacts on the surfaces of the routing die 104 and the logic die 102, using what is referred to as 2.5 or 3 dimensional device integration. The fixed circuit mask can be readily generated from the programmed circuit topology by simply including or omitting each possible via based on the state of the corresponding reprogrammable switch (transistor in this case) interconnecting the corresponding layers of the logic and routing dies, and vice versa. The translation of the programmed circuit topology to the fixed circuit topology is particularly straightforward because the state of a reprogrammable switch is programmed by effectively storing a single bit of information representing the state of that switch as either open or closed. Since the state of each reprogrammable switch represents either the presence or absence of a via in the final via-programmed circuit, the translation involves a direct mapping of the bit for each switch state to the presence or absence of a via at the corresponding via location of the unmodified logic die.

The inverse operation can also be performed if desired, whereby a via instantiated in a via-programmed device can be used to set the state of a corresponding programmable switch as being closed or conductive, with the absence of a via setting the state as being open or non-conductive.

Since the fixed circuit version of the developed integrated circuit uses the "single via mask" and has the cost advantages described above, this allows a fixed circuit version of the reprogrammable integrated circuit to be implemented in a cost effective manner.

Figure 12:
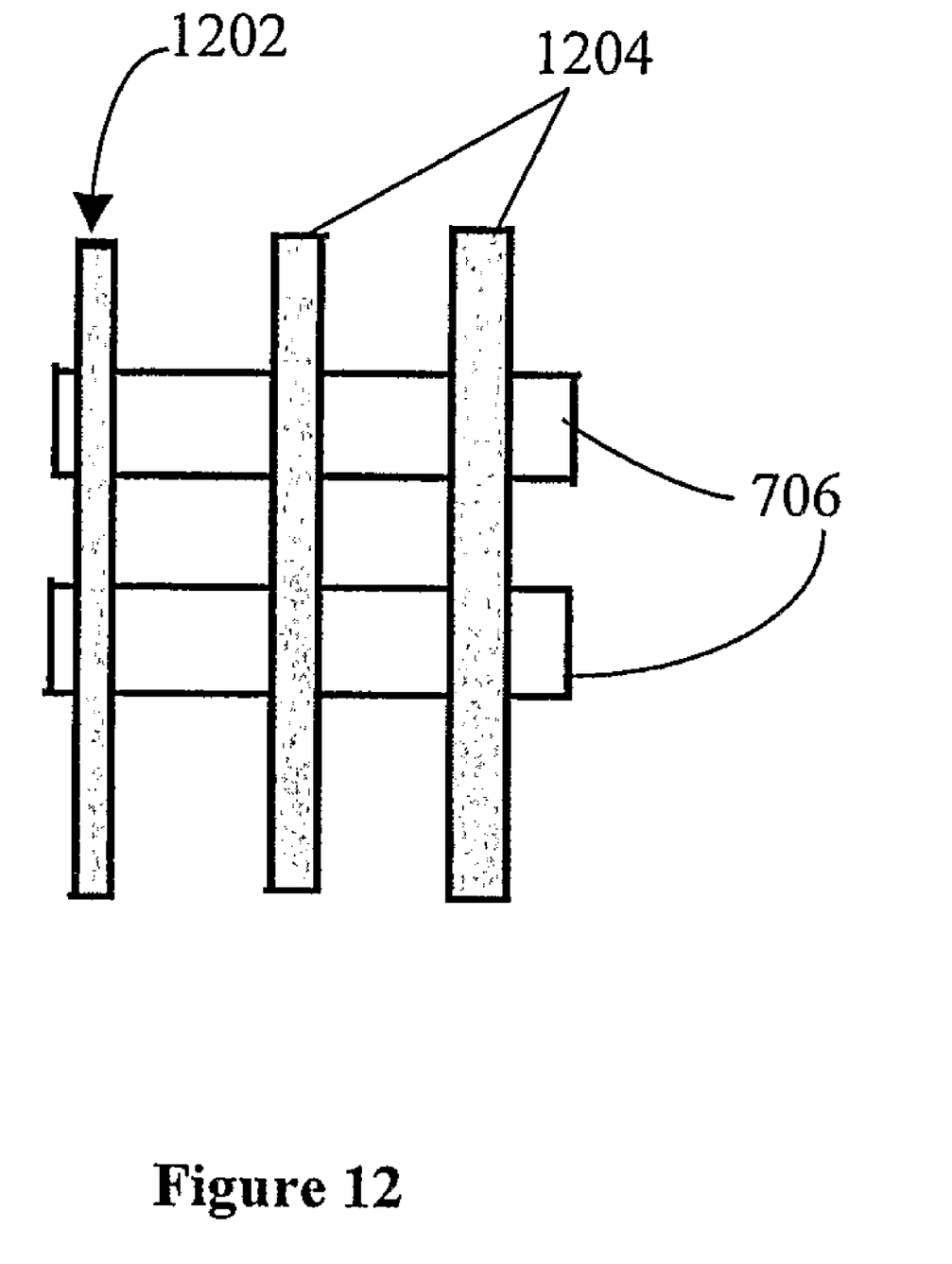
FIG. 12 is a schematic plan view of crossbar type via-programmable metal routing layers illustrating the use of a high density process technology (e.g., 0.13 μm) to form finer selected of routing lines when prototyping an integrated circuit; the corresponding production circuit can be produced using a lower density process technology (e.g., 0.18 μm) to reduce costs.

Additionally, a more advanced process technology can be used to form at least the routing layer in the logic die and/or the reprogrammable interconnect die than will be used in the final production logic die in order to provide a higher density of routing lines and/or to allow additional space for other circuit components. For example, as shown in FIG. 12, the routing line 1202 is substantially finer than the other routing lines 1204, 706.

As with the other embodiments described herein, each reprogrammable switch in the routing die can be a transistor switching circuit whereby an NMOS transistor has its source and drain terminals attached respectively to two wiring nodes for which it is desired to provide a programmable form of conductive path in place of a customizable via. The gate of the NMOS transistor is controlled by an electrical circuit or some other type of programmable or configurable storage or other type of reprogrammable circuit element that exhibits electrical state hysteresis. Typically this is a static random access memory ("SRAM") cell. The SRAM cell may be a purpose designed circuit containing five or six transistors, which is of a type that exists in common use including many FPGAs. Alternately any other form of storage or state hysterisis device can be used, including antifuse memory devices (which can also be used as an alternative to the switchable conductivity function provided by the NMOS transistor), Programmable Read Only Memory (PROM), Erasable PROM (EPROM), Electrically Erasable PROM (EEPROM), or any other form of device capable of being integrated into the device fabric.

It will be apparent to those skilled in the art that other devices may be used instead of the NMOS pass transistor to form a programmable conductive path, including a PMOS transistor, combinations of NMOS and PMOS devices coupled in parallel to form a pass gate, buffers, micromechanical circuits including devices that use conductive pastes, programmable fuses or antifuse devices such as those commonly used by Actel Corporation of the USA.

In one embodiment, the logic die 102 is based on ViaMask™ programmable fabric provided by the US Company ViASIC. As described above, such fabrics provide an arrangement of allowable optional via interconnect locations substantially arranged in an array formation in the routing layer of a fixed via-programmed device. In this embodiment, a programmable switch is employed within a stacked routing die to substitute for the optional vias that would normally be used to program the ViaMask™ fabric. However, it is not necessary to provide a programmable switch at every possible optional-via-interconnect location because fabrics such as ViaMASK™ provide more possible via locations than are required for most applications. Consequently, the omission of programmable switches at some locations has only a minor impact on routability. The elimination of the option to place vias at selected locations in the final design reduces the total number of programmable switches required to implement a programmable version of the device substantially compatible with the fixed via-mask programmable fixed fabric. This allows for improvement of the trade-off between routability and routing die density to be achieved through selection of the ratio of programmable switches to optional-via-interconnected locations, Using this approach, the fixed design is constrained to allow vias only at locations that were programmable in the programmable device version, thus improving the ease of mapping and design compatibility, or alternatively the user can be allowed to utilise optional via locations in the fixed device that do not necessarily correspond with programmable switch locations in the programmable device to optimise the fixed design for routability or performance.

This embodiment employs a logical association between the configuration of programmable switches and the configuration of otherwise allowable optional-via-interconnect positions, similar to the "subset switch block" arrangement employed in FPGAs and described in Schmit and Chandara "FPGA Switch Block Layout and Evaluation" FPGA '2 February 2426, 2002, Monterey, Calif., USA. Alternatively, other configurations, such as the Universal or Wilton configurations known to those skilled in the art, or other switch configurations may be employed.

When only a subset of all possible via locations are replaced by programmable interconnect switches in a "single-via-mask" programmable device applied to a fabric such as the ViASIC ViaMASK™ fabric, herein referred to as a ViaMASK™ "subset switch block" design, further advantage compared with traditional FPGA switching circuits can be achieved by selection of a particular subset switch logical configuration.

The ViaPATH fabric employs a fabric constructed from an array of "tiles", each tile containing approximately eleven normalised equivalent gates, some memory, and a routing "cross-hatch" design that is formed by two metal layers as a set of orthogonal (vertical/horizontal in plan view) metal lines or partial routes across the area of each tile. The metal cross hatch can be provided on any two adjacent conductive layers, for instance metal 3 and metal 4, and is "programmed" by selection of the optional vias that can be formed to provide a conductive path between the corresponding metal lines/layers. Optional via interconnects are also provided at the west ends of each tile and also at the north ends. The abutment of tiles thus inherently provides effectively a programmable via at the east and south ends of the tile (provided by the adjacent tile).

In a ViaMASK™ "subset switch block" embodiment, programmable switches are provided in a logical configuration such that one programmable interconnect circuit is employed to replace each of the east and north vias. Also, where the vias across the centre of the tile contain an array of optional via interconnects, a subset of these optional via interconnects are selected and replaced with switches in the programmable version of the device so that only a single programmable interconnect switch is provided per horizontal tile cross route (not including the east connections). Similarly only a single programmable interconnect switch is provided per vertical cross route (not including the north connections). Advantageously, this arrangement provides adequate overall routability and yet substantially reduces the number of transistors required to form the programmable interconnect functionality. Specifically, the number of switches (e.g., pass transistors) required is at worst three times W, the number of horizontal/vertical routing lines. For example, with three horizontal routing lines in metal 1 and three vertical routing lines in metal 2 (i.e., W=3), this arrangement reduces the number of switches required to 3 W=9. For comparison, an island style FPGA architecture requires 6 W switches; i.e., twice as many as the reprogrammable integrated circuit. This switch connectivity architecture is referred to herein as a "crossbar switch architecture" to distinguish it from an "island-style" FPGA architecture known to those skilled in the art.

In a similar fashion, alternative subsets of possible via locations can be selected to vary the tradeoffs between the number of programmable interconnect switches per tile and the relative density or capacity of the routing and logic blocks.

Advantageously, the ViaMASK™ subset switch block arrangement described above requires only three programmable switch NMOS/SRAM pairs per programmable connection, being one east, one north and one at the programmable via location. Alternative approaches using traditional FPGA switch blocks in an island style FPGA require six transistors per switch point, being one between each of the north, south, east and west routing ports to the switch block, i.e., north-south, north-west, north-east, south-west, south-east and east-west.

Thus the cross-bar switch architecture described herein provides the advantage that as few as half the number of programmable interconnect transistors can be used to provide the switching function relative to island-style FPGAs. Island style FPGAs are unable to replicate the equivalent transistor efficiency because they lack the capability to abut switch and share block units.

Although the reprogrammable integrated circuits described herein have been described in terms of direct electrical connections between one or more reprogrammable interconnect dies and one or more logic dies bonded together in a stacked configuration, it will be apparent that connections between dies can alternatively made by other means, including wireless electromagnetic and optical connections.

Many modifications will be apparent to those skilled in the art without departing from the scope of the present invention as herein described with reference to the accompanying drawings.

The invention claimed is:

1. An interconnect die comprising:
reprogrammable interconnection components configured to define programmable signal routing paths between circuit components of one or more logic dies when connected thereto, thus facilitating development of an integrated circuit consisting of interconnected circuit components of the one or more logic dies so that the interconnect die with programmed interconnection components can later be replaced by fixed connection paths corresponding to signal routing paths defined by the programmed interconnection components to provide the developed integrated circuit.

2. An interconnect die according to claim 1, wherein said interconnect die is configured for bonding to said one or more logic dies in a stacked configuration.

3. An interconnect die according to claim 2, wherein said interconnect die is configured for bonding to one or more other interconnect dies in a stacked configuration.

4. An interconnect die according to claim 3, wherein said interconnect die includes electrical interconnect paths configured for connection to corresponding electrical interconnect paths of said one or more logic dies.

5. An interconnect die according to claim 4, including at least one of electrical contact pads, points, vias, optical connectors, and wireless interconnect for connection to corresponding components of at least one of said one or more logic dies.

6. An interconnect die as in claim 1 consisting only of the reprogrammable interconnection components.

7. An interconnect die as claimed in claim 6, wherein the interconnect die is adapted to define signal routing paths between circuit components of a logic die corresponding to a via-programmable logic die.

8. An interconnect die as claimed in claim 7, wherein each signal routing path is defined by the state of a corresponding single pass transistor of the interconnect die.

9. An interconnect die as claimed in claim 8, wherein at least one of the one or more logic dies is based on a via-programmable logic die, and the interconnect die includes reprogrammable interconnection components for only a subset of the programmable via locations of said via-programmable logic die.

10. A reprogrammable interconnect comprising:
a plurality of reprogrammable interconnect dies bonded together in a stacked configuration, each of said plurality of reprogrammable interconnect dies including reprogrammable interconnection components configured to define signal routing paths between circuit components of one or more logic dies when connected thereto, thus facilitating development of an integrated circuit consisting of interconnected circuit components of the one or more logic dies so that the reprogrammable interconnect with programmed interconnection components can later be replaced by fixed connection paths corresponding to signal routing paths defined by the programmed interconnection components to provide the developed integrated circuit.

11. A reprogrammable integrated circuit comprising:
one or more logic dies including circuit components; and
one or more reprogrammable interconnect dies including reprogrammable interconnect components electrically connected to said circuit components to define signal routing paths between said circuit components to allow a user to develop an integrated circuit,
wherein each of said one or more reprogrammable interconnect dies includes bond pads,
wherein the bond pads on the one or more reprogrammable interconnect dies are connected to corresponding bond pads on the one or more logic dies, and
wherein the bond pads on the one or more reprogrammable interconnect dies are connected to corresponding bond pads on the one or more logic dies by reprogrammable interconnect components.

12. A reprogrammable integrated circuit comprising:
one or more logic dies including circuit components; and
one or more reprogrammable interconnect dies including reprogrammable interconnect components electrically connected to said circuit components to define signal routing paths between said circuit components to facilitate development of an integrated circuit consisting of interconnected circuit components of the one or more logic dies so that the reprogrammable interconnect dies with programmed interconnect components can later be replaced by fixed connection paths corresponding to signal routing paths defined by the programmed interconnect components to provide the developed integrated circuit.

13. A reprogrammable integrated circuit according to claim 12, wherein at least one of said reprogrammable interconnect dies and/or at least one of said one or more logic dies includes at least one of clock distribution logic, test and scan path connectivity, observation, or control circuitry, power distribution, I/O, bonding pads, and logic blocks.

14. A reprogrammable integrated circuit according to claim 13, wherein said one or more logic dies and said one or more reprogrammable interconnect dies are bonded together in a stacked configuration.

15. A reprogrammable integrated circuit according to claim 14, wherein the reprogrammable integrated circuit includes package bonding connections between bond pads on one of said logic dies and a package.

16. A reprogrammable integrated circuit according to claim 15, wherein the reprogrammable integrated circuit includes package bonding connections between bond pads on one of said one or more reprogrammable interconnect dies and a package.

17. A reprogrammable integrated circuit according to claim 16, wherein each of said one or more reprogrammable interconnect dies includes bond pads.

18. A reprogrammable integrated circuit according to claim 17, wherein the bond pads on the one or more reprogrammable interconnect dies are connected to corresponding bond pads on the one or more logic dies.

19. A reprogrammable integrated circuit according to claim 12, wherein said circuit components include memory, logic, and input/output components.

20. A reprogrammable integrated circuit according to claim 19, wherein said circuit components of said one or more logic dies are electrically connected to reprogrammable routing components of said one or more reprogrammable interconnect dies by vies.

21. A reprogrammable integrated circuit as claimed in claim 20, wherein each signal routing path is defined by the state of a corresponding single pass transistor of the interconnect die.

22. A reprogrammable integrated circuit as claimed in claim 21, wherein at least one of the one or more logic dies is based on a corresponding via-programmable logic die to enable the via-programmable logic die to be programmed to provide the developed integrated circuit.

23. A reprogrammable integrated circuit as claimed in claim 22, wherein at least one of the one or more interconnect dies includes reprogrammable interconnection components for only a subset of the programmable via locations of said via-programmable logic die.

24. A reprogrammable integrated circuit as claimed in claim 12, wherein at least one of the one or more reprogrammable interconnect dies is substantially larger than a corresponding one of the one or more logic dies, wherein logic, storage and/or testing circuitry is provided on a projecting portion of the at least one reprogrammable interconnect die.

25. A reprogrammable integrated circuit as claimed in claim 24, wherein at least one of the one or more reprogrammable interconnect dies includes circuit components for testing a circuit topology developed using the reprogrammable integrated circuit.

26. A reprogrammable integrated circuit as claimed in claim 25, wherein at least one of the one or more logic dies is substantially identical to a commercially available logic die but includes additional circuit components for testing a circuit topology developed using the reprogrammable integrated circuit.

27. A reprogrammable integrated circuit as claimed in claim 26, wherein at least one of the one or more reprogrammable interconnect dies was manufactured using a higher performance process technology than that used to manufacture at least one of the one or more logic dies.

28. A reprogrammable integrated circuit as claimed in claim 27, wherein at least one of the one or more reprogrammable interconnect dies was manufactured using a higher density process technology than that used to manufacture at least one of the one or more logic dies.

29. A reprogrammable integrated circuit comprising:
one or more logic dies including circuit components; and
one or more reprogrammable interconnect dies including reprogrammable interconnect components electrically connected to said circuit components to define signal routing paths between said circuit components to allow a user to develop an integrated circuit,
wherein at least one of the one or more logic dies is based on a corresponding via-programmable logic die to enable the via-programmable logic die to be programmed to provide the developed integrated circuit, and
wherein at least one of the one or more reprogrammable interconnect dies includes a metal layer corresponding to at least part of a metal layer of the via-programmable logic die, the at least one logic die omitting the at least part of the metal layer of the via-programmable logic die, wherein the at least one reprogrammable interconnect die includes at least one reprogrammable switch connected between the metal layer in the at least one reprogrammable interconnect die and a metal layer in the at least one logic die.

30. A reprogrammable integrated circuit as claimed in claim 29, wherein at least one of the one or more reprogrammable interconnect dies is substantially different in size from at least one of the one or more logic dies, wherein connectors are provided on a projecting portion of the larger of the at least one reprogrammable interconnect dies and the at least one logic die.

31. An integrated circuit production process, including comprising:
programming at least one reprogrammable interconnect die to form programmed signal routing paths between circuit components of at least one first logic die electrically connected to said at least one programmable interconnect die; and
forming fixed signal routing paths between circuit components of at least one second logic die substantially equivalent to said at least one first logic die, said fixed signal routing paths corresponding to said programmed signal routing paths.

32. A process according to claim 31, wherein said at least one second logic die is substantially identical to said at least one first logic die.

33. An integrated circuit production process, including comprising:
generating fixed routing path data for use in forming fixed signal routing paths between circuit components of at least one first logic die on the basis of programmed signal routing paths path data defining programmed signal routing paths between circuit components of at least one second logic die electrically connected to at least one reprogrammable interconnect die, the circuit components of said at least one second logic die being substantially equivalent to circuit components of said at least one first logic die.

34. An integrated circuit formed by executing the steps of claim 33.

35. An integrated circuit system having components for executing the steps of claim 33.

36. A computer readable storage medium having stored thereon program instructions for executing the steps of claim 33.

37. An integrated circuit production process, including comprising:
generating programmed routing path data for use in forming programmed signal routing paths between circuit components of at least one first logic die on the basis of fixed signal routing paths defining programmed signal routing paths between circuit components of at least one second logic die electrically connected to said at least one reprogrammable interconnect die, the circuit components of said at least one second logic die being substantially equivalent to said at least one first logic die.

38. A process according to claim 37, wherein said at least one second logic die includes a via-programmable logic die.

39. An integrated circuit production process comprising:
programming at least one reprogrammable interconnect die to form programmed signal routing paths between circuit components of at least one first logic die electrically connected to said at least one programmable interconnect die; and
forming fixed signal routing paths between circuit components of at least one second logic die substantially equivalent to said at least one first logic die, said fixed signal routing paths corresponding to said programmed signal routing paths,
wherein said at least one second logic die includes a via-programmable logic die, and
wherein said via-programmable logic die includes conductive routing paths for interconnection by at least one via, and said at least one first logic die includes a logic die based on the via-programmable logic die, at least part of at least one of said conductive routing paths being omitted from said logic die based on the via-programmable logic die, at least one corresponding conductive routing path being provided in said at least one reprogrammable interconnect die and switchably connected to a conductive routing path in said logic die based on the via-programmable logic die.

* * * * *